(12) United States Patent
Herault et al.

(10) Patent No.: US 8,736,393 B2
(45) Date of Patent: May 27, 2014

(54) VARIABLE CAPACITANCE INTEGRATED ELECTRONIC CIRCUIT MODULE

(75) Inventors: Guillaume Herault, Rennes (FR); Herve Marie, Ver sur Mer (FR)

(73) Assignee: ST-Ericsson SA, Plan-les-Ouates (CH)

( * ) Notice: Subject to any disclaimer, the term of this patent is extended or adjusted under 35 U.S.C. 154(b) by 351 days.

(21) Appl. No.: 13/318,915

(22) PCT Filed: May 3, 2010

(86) PCT No.: PCT/EP2010/055982
§ 371 (c)(1),
(2), (4) Date: Nov. 4, 2011

(87) PCT Pub. No.: WO2010/128017
PCT Pub. Date: Nov. 11, 2010

(65) Prior Publication Data
US 2012/0052926 A1      Mar. 1, 2012

(30) Foreign Application Priority Data

May 5, 2009   (FR) ...................................... 09 52992

(51) Int. Cl.
*H03M 1/00*     (2006.01)
*H03M 1/12*     (2006.01)

(52) U.S. Cl.
USPC ................. 331/167; 331/117 R; 331/117 FE; 331/177 V; 331/179; 341/144; 341/172; 341/155; 341/122

(58) Field of Classification Search
CPC .................. H03M 1/00; H03M 1/12
USPC ........... 331/179, 167, 117 R, 117 FE, 177 V; 341/122, 172, 150, 144
See application file for complete search history.

(56) References Cited

U.S. PATENT DOCUMENTS

| | | | |
|---|---|---|---|
| 5,140,327 A * | 8/1992 | Bruce et al. .................... | 341/172 |
| 5,322,438 A | 6/1994 | McNutt et al. | |
| 5,952,952 A | 9/1999 | Choi et al. | |
| 8,159,379 B2 * | 4/2012 | Ritt et al. ....................... | 341/122 |
| 8,212,627 B2 * | 7/2012 | Yang et al. .................... | 331/179 |
| 8,537,046 B2 * | 9/2013 | Zhao et al. .................... | 341/172 |
| 2008/0002332 A1 | 1/2008 | Chen | |
| 2008/0122670 A1 | 5/2008 | Klaassen | |

FOREIGN PATENT DOCUMENTS

WO         0209280 A1    1/2002

* cited by examiner

*Primary Examiner* — Arnold Kinkead
(74) *Attorney, Agent, or Firm* — Coats & Bennett, P.L.L.C.

(57) ABSTRACT

A digitally controlled variable capacitance integrated electronic circuit module (100) comprises a set of basic cells in a matrix arrangement. Each basic cell itself comprises a functional block (11) which can be switched between two individual capacitance values, a control block (12), and a control junction connecting the control block and the functional block of said basic cell. The functional blocks and the control blocks are grouped into separate regions (110, 120) of the matrix arrangement, to reduce capacitive interaction between output paths and power supply paths of the module. The functional blocks can still be switched in a winding path order within the matrix arrangement. A module of the invention can be used in an oscillator capable of producing a signal at 4 GHz.

12 Claims, 9 Drawing Sheets

VARIABLE CAPACITANCE INTEGRATED ELECTRONIC CIRCUIT MODULE

BACKGROUND

The present invention relates to a variable capacitance integrated electronic circuit module which is digitally controlled. It also relates to a variable frequency oscillator which comprises such a module, and also a mobile telephone terminal which comprises the oscillator.

Many electronic circuit applications require implementing a capacitor assembly with variable value. In particular, the capacitor assembly may be digitally controlled, so that its capacitance value is controlled by a digital control code. The capacitor assembly is then electrically equivalent to an electric condenser which has a capacitance corresponding to the digital control code. When this control code varies, its variations produce switching operations within the capacitor assembly, so that the capacitance value itself varies in response to the variations in the control code.

FIG. 1 is a layout diagram of a digitally controlled variable capacitance integrated electronic circuit module of the prior art, on a circuit substrate. The module, indicated in all drawings by reference number 100, comprises a set of basic cells 10 which each have a functional block 11 and a control block 12, with a control junction which connects the control block 12 and the functional block 11 of the same cell. The functional block 11 is capable to be switched between multiple, generally two, individual capacitance values. The functional blocks 11 and the control blocks 12 are distributed on the surface of the integrated circuit substrate in a matrix arrangement, which is formed of columns and rows of juxtaposed blocks. X designates the direction of the rows and Y designates the direction of the columns. The directions X and Y are respectively horizontal and vertical in the figure.

In a known layout, the functional blocks 11 on one hand and the control blocks 12 on the other hand are distributed in separate, successively alternating columns. Thus a column of functional blocks 11 is intermediate between two columns of control blocks 12 and vice versa. The module 100 additionally comprises:

two output paths, respectively labeled 1 and 2, which are each formed of path segments placed above the substrate and parallel to the direction X of the rows of the matrix arrangement; and two power supply paths, respectively labeled 4 and 5, which are also placed above the substrate.

Each functional block 11 of the module 100 has two output terminals, which are respectively connected to a segment of one of the two output paths 1 or 2, and to a segment of the other output path. In other words, the functional blocks 11 of all the basic cells 10 are connected in parallel between the two output paths 1 and 2, so that their individual capacitance values are added to produce the capacitance value of the module 100. The variable capacitance of the module 100 is therefore produced between the two output paths 1 and 2. In addition, the segments of output paths 1 and 2 alternate between one and the other of the two output paths along the direction Y of the columns.

Furthermore, each control block 12 has two power supply terminals which are respectively connected to one and the other power supply path 4 and 5. These two power supply paths 4 and 5 can be respectively connected to a positive terminal labeled Vcc of a power source for the module 100 and to a ground terminal labeled Gnd.

In a common layout, the two power supply paths 4 and 5 are each formed of path segments arranged in parallel to the direction Y of the columns in the matrix arrangement. In addition, these power supply path segments can be superimposed in different metallization levels above the substrate of the module 100, with the segments of path 4 being in line with the segments of path 5. For this reason, the segments of the power supply paths 4 and 5 appear intermingled in FIG. 1.

As an example, FIG. 2 is a circuit diagram of a possible embodiment of the basic cell 10 for such a digitally controlled variable capacitance integrated electronic circuit module. The operation of such basic cells is assumed to be known to a person skilled in the art, and is not described in detail here. The reference number 6 indicates the control junction connecting the control block 12 and the functional block 11 of one and same cell 10. The segments of the power supply paths 4 and 5 again appear superimposed in this figure. FIG. 2 also shows that each control block 12 comprises a doped well which is formed in the substrate of the module 100. For illustrative purposes, this doped well is assumed to be an N-type well and is labeled N-well. The letters R, C and H respectively indicate three control bits of the module 100, which together form the digital control code for each basic cell of the capacitance of the module 100.

In a known manner, when the capacitance value of the module 100 is ordered to increase progressively, the basic cells 10 are switched in a determined order. Advantageously, this switching order corresponds to a winding path through all functional blocks 11 in the matrix arrangement of the module 100. In FIG. 1, this path is symbolized by the line with arrows labeled T. It is composed of a continuous path traveling back and forth in parallel to the direction X of the rows of the matrix arrangement, and progressively offset in parallel to the direction Y of the columns.

The segments of output paths 1 and 2 are also distributed in the metallization levels which are superimposed on the substrate of the module 100. In the arrangement in FIG. 1, each segment of the output paths 1 or 2 successively crosses all segments of the power supply paths 4 and 5, when projected into a plane parallel to the surface of the substrate. Each intersection is the site of capacitive interaction between the power supply path segment and the output path segment concerned. This capacitive interaction is represented in FIG. 2 by a capacitor symbol of dotted lines designated by the letter P. Four capacitances from path segment intersections are then added to the individual capacitance value of the functional block 11 of each basic cell 10, and in particular to the minimum individual capacitance value of this cell. Because of this interaction between output paths and power supply paths, it is not possible to obtain a minimum capacitance value of the module 100 which is less than 4.2 pF (picofarad). When such a module 100 is associated with an inductor within a variable frequency oscillator, the minimum capacitance value of the module 100 determines the maximum oscillation frequency which is possible for the oscillator. For example, with an inductor of 0.7 nH (nanohenry) and a variable capacitance module 100 as has just been described, the oscillator cannot produce a periodic signal at a frequency of 4 GHz (gigahertz). However, there are more and more devices such as mobile telephone terminals which require oscillators capable of producing very high variable frequency signals of 4 Ghz or more.

In addition, each functional block 11 contains doped areas, in particular positively doped areas, which must be separated from the N-wells of the control blocks 12. The alternation of positively doped areas and N-wells in the substrate of the module 100, along the direction X of the rows of the matrix arrangement, prevent closer placement of the columns. For this reason, the level of integration of the variable capacitance module cannot be increased beyond a limit value.

A first object of the invention is therefore to realize variable capacitance integrated electronic circuit modules which have a minimum capacitance value of less than 4.2 pF.

SUMMARY

A second object of the invention is to provide variable frequency oscillators which have a maximum frequency greater than or equal to 4 GHz.

A third object of the invention is to provide a variable capacitance integrated electronic circuit module which satisfies one and/or the other of the two previous objects, and for which the level of integration is not inferior to that of known modules.

To achieve these objects, the invention proposes a digitally controlled variable capacitance integrated electronic circuit module which is distinguished from known prior art modules by the distribution of the functional blocks and control blocks on the surface of the substrate.

In a first characteristic of the invention, the control blocks are grouped within the matrix arrangement into control regions which each comprise several row portions. These row portions each comprise several juxtaposed control blocks, and are adjacent in the matrix arrangement and offset in parallel to the columns. The functional blocks are then situated outside these control regions, in functional regions of the matrix arrangement which are separate from the control regions.

In a second characteristic of the invention, the two power supply paths are formed of supply path segments which are also arranged in parallel to the rows of the matrix arrangement within the control regions, outside the functional regions, and the output path segments are arranged within the functional regions, outside the control regions.

In this manner, the output path segments and the power supply path segments are all parallel to the rows of the matrix arrangement. The circuit module no longer has intersections between the output path segments and the power supply path segments. The capacitive interactions of such intersections are therefore eliminated by the invention.

In addition, the output path segments and the power supply path segments are arranged in separate regions of the module. In this manner, the capacitive interactions between the segments of these two types of paths are further reduced.

Also, the control blocks no longer alternate with the functional blocks of the module in the direction of the rows of the matrix arrangement. The constraint of separating the doped areas of the functional blocks from the doped wells of the control blocks no longer exists. The columns of the matrix arrangement can therefore be brought closer together and the module can thus have an increased level of integration.

A variable capacitance integrated electronic circuit module of the invention may in particular comprise between 1,000 and 10,000 basic cells.

Because of the reduction or elimination of the capacitive interaction between the output path segments and the power supply path segments according to the invention, the minimum capacitance value of the module may be less than 3.0 pF, or even less than 2.5 pF.

The invention also proposes a digitally controlled variable frequency oscillator, which comprises an inductor and a variable capacitance integrated electronic circuit module as described above. Such oscillator may be adapted to produce a periodic signal with a maximum frequency which is greater than 3.5 GHz, and in particular between 3.3 and 4.5 GHz, in response to a digital control code which is transmitted to the variable capacitance integrated electronic circuit module, and which corresponds to the minimum capacitance value of this module.

It also proposes a mobile telephone terminal which comprises such a digitally controlled variable frequency oscillator.

BRIEF DESCRIPTION OF THE DRAWINGS

Other advantages and features of the invention will become apparent from the following description of a non-limiting example with reference to the accompanying drawings, in which.

In these figures, identical reference labels indicate identical elements, or elements which have identical functions. In particular, X and Y again respectively designate in FIGS. 3a to 3d and FIG. 4 the directions of the rows and columns of the matrix arrangement of the digitally controlled variable capacitance integrated electronic circuit module.

DETAILED DESCRIPTION

Figure 1:
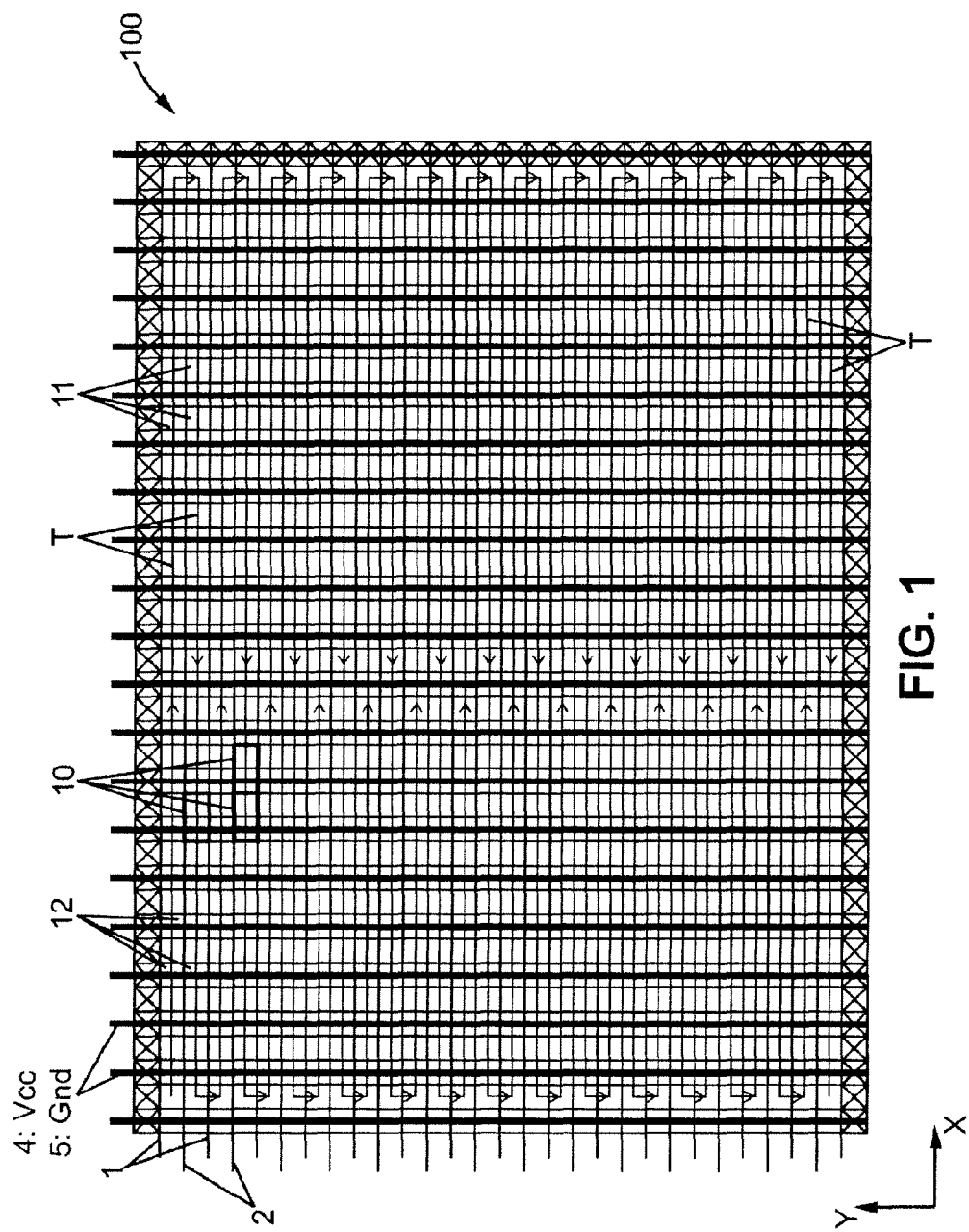
FIG. 1, already described, is a layout diagram of a digitally controlled variable capacitance integrated electronic circuit module as known in the prior art.
Figure 2:
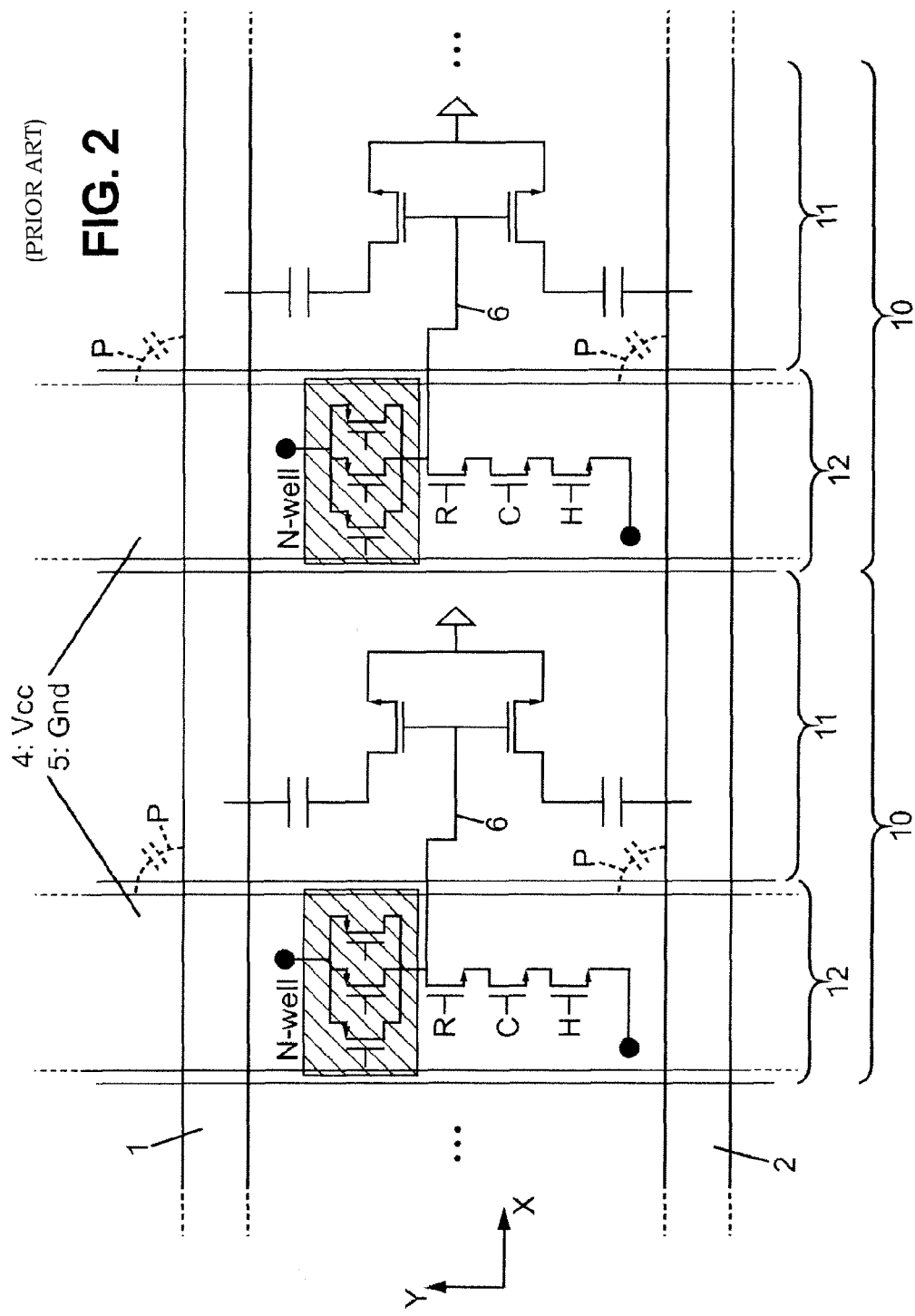
FIG. 2, already described, is a circuit diagram of two basic cells of a digitally controlled variable capacitance integrated electronic circuit module, as known in the prior art.

The electronic elements in FIGS. 1 and 2 are thus used again individually in the subsequent figures, without it being necessary to repeat their descriptions. Indeed, one of the objects of the invention is a new layout of these elements within the integrated electronic circuit module, without necessarily modifying the principle or function of each individual element.

Figure 3A:
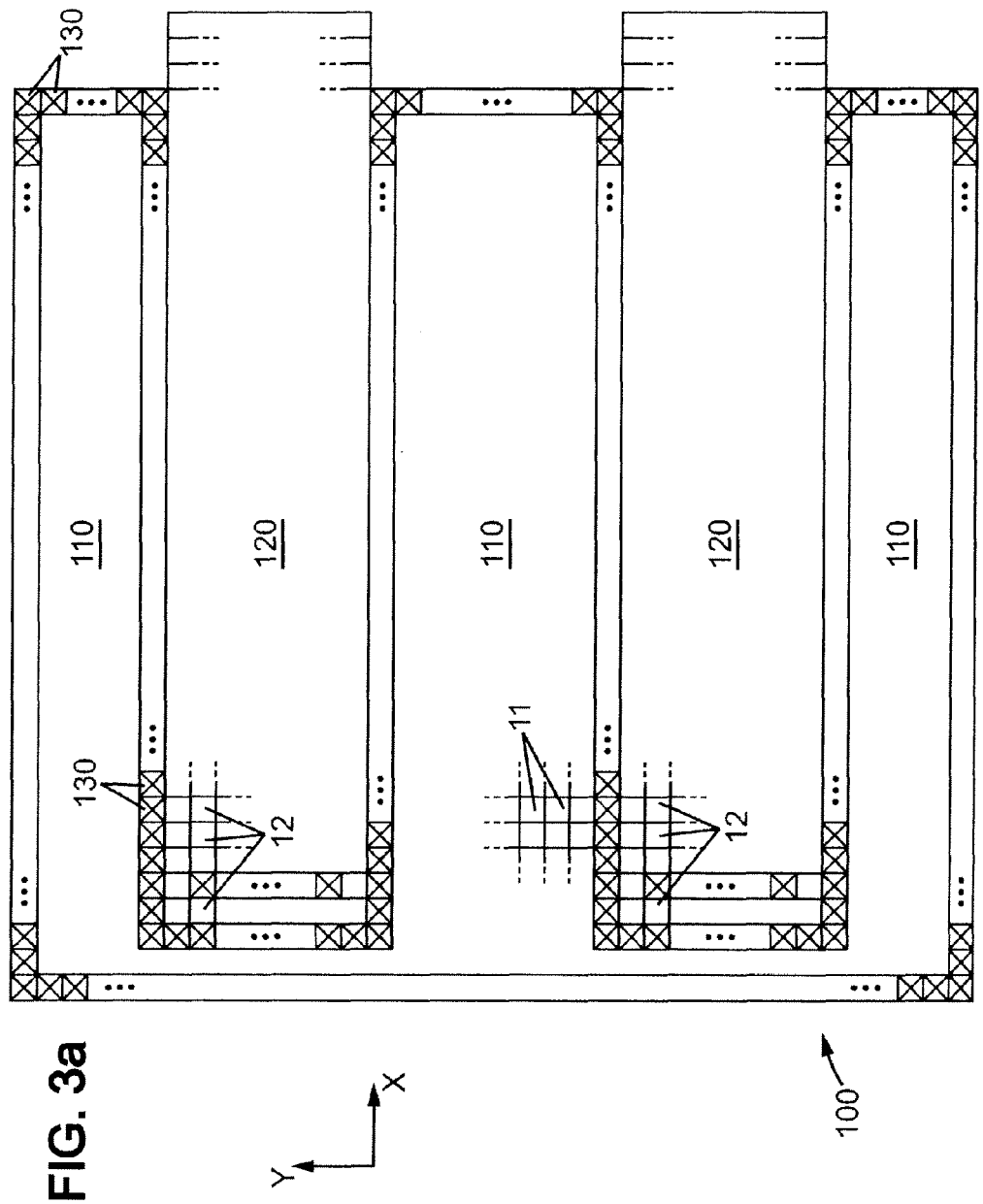
FIGS. 3a to 3c represent the same layout diagram for a digitally controlled variable capacitance integrated electronic circuit module according to the invention.

As illustrated in FIGS. 3a to 3d, a variable capacitance integrated electronic circuit module 100 of the invention is still composed of basic cells 10, but the functional block 11 and the control block 12 of each basic cell are no longer laid out next to each other on the circuit substrate. All the control blocks 12, or at least a major part of them, are grouped within the matrix arrangement in one or more control regions 120 (FIG. 3a). The functional blocks 11 are then grouped in one or more functional regions 110, which is (are) separate from the control regions 120.

In a preferred layout of the control blocks 12, each control region 120 may comprise at least four, preferably at least eight, row portions which are adjacent in the matrix arrangement and offset parallel to the columns. In this case, each control region 120 may advantageously have an outside perimeter which is rectangular in the arrangement. However, it is not necessary that each control region 120 be a complete horizontal slice of the matrix arrangement. For example, in the layout which is represented in FIGS. 3a to 3d, each region 120 stops three block positions before the left edge of the matrix arrangement.

In addition, at least some of the row portions which constitute each control region 120 may each comprise at least four, preferably at least eight, adjacent control blocks 12. In this manner, use of the surface are of the circuit module 100 can be optimized.

Figure 4:
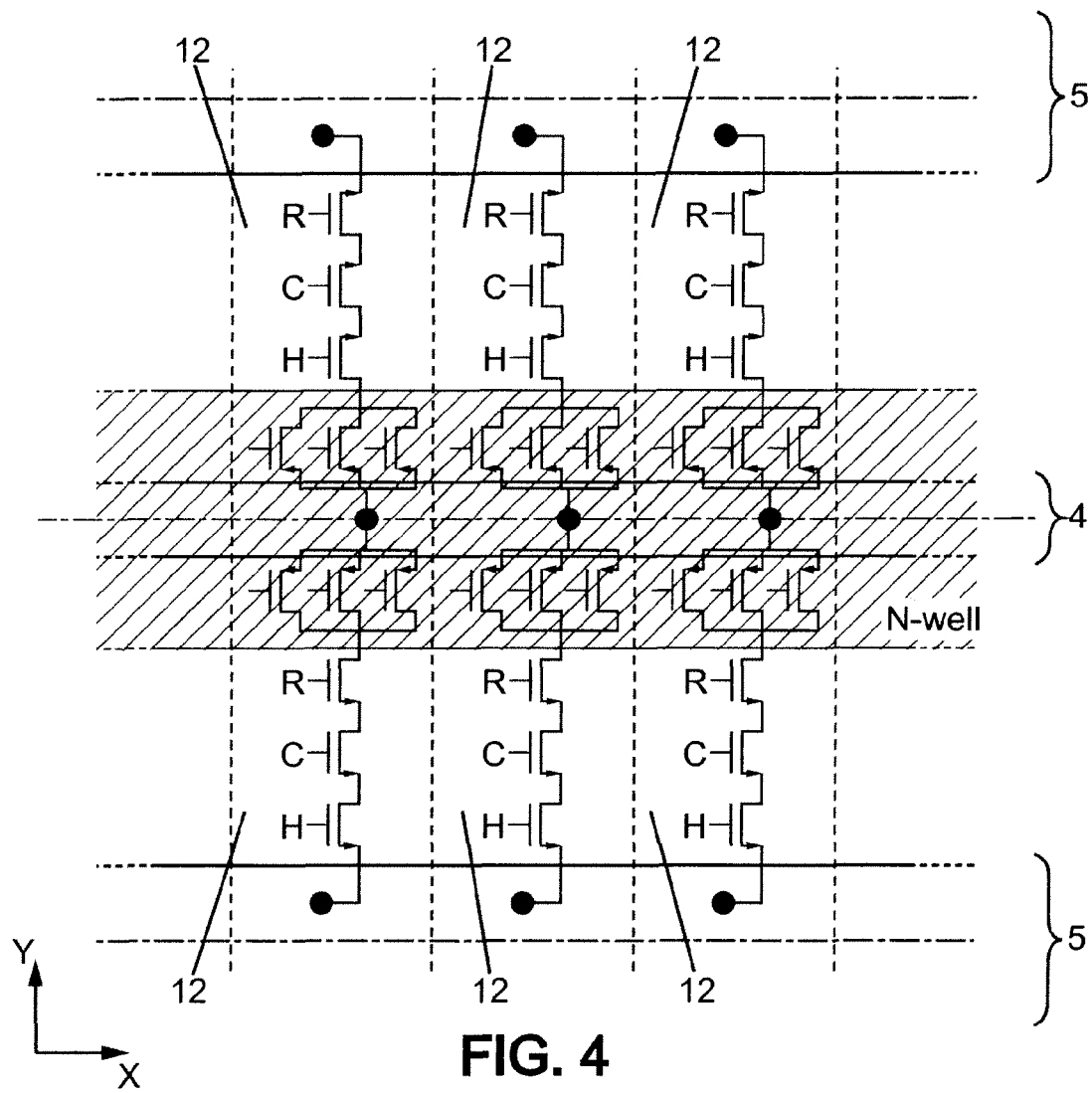
FIG. 4 is a circuit diagram of a possible layout pattern for a control region of a digitally controlled variable capacitance integrated electronic circuit module as shown in FIGS. 3a to 3d.

Due to the already explained composition of each control block 12, the substrate of the integrated electronic circuit module has doped wells in the control regions 120. Thanks to the invention, these doped wells can extend continuously between several adjacent control blocks 12, inside each control region 120. In other words, the same continuous doped well, for example an N-well, may be shared by several control blocks 12 by extending continuously across these control blocks in parallel to the rows of the matrix arrangement, inside each control region 120. FIG. 4 illustrates a pattern of the control regions 120, with the continuous doped well extending in parallel to the direction X of the rows of the matrix arrangement. The columns of the matrix arrangement can then be brought closer together, and the reduction in their width can reach 10%. In addition, the doped well may be shared by two row portions of control blocks 12 which are adjacent in the Y direction, by straddling these two row portions.

Figure 3B:
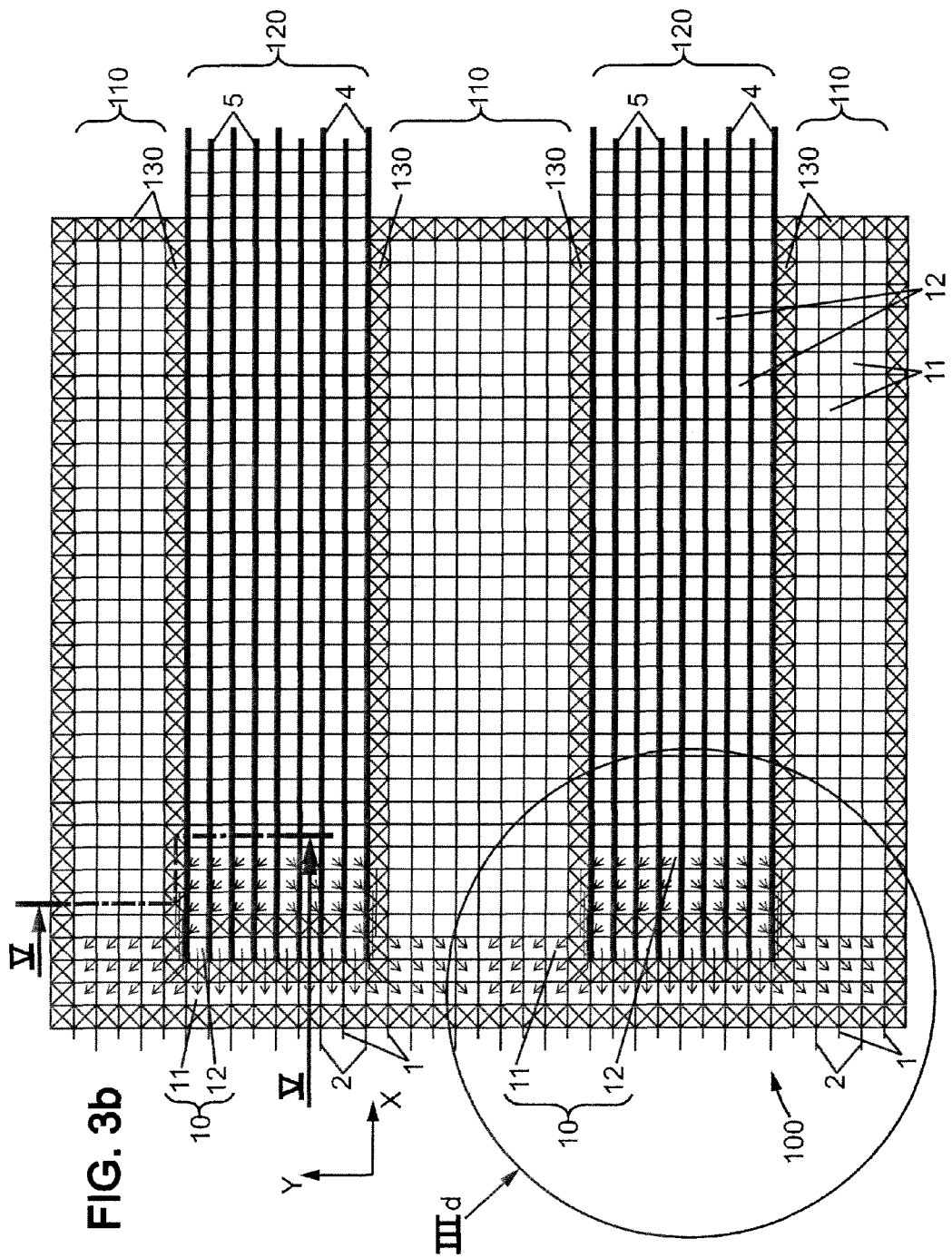

The layout of the power supply paths 4 and 5 can then be limited to inside the control regions 120. In these regions 120, the paths 4 and 5 may each be composed of segments which are parallel to the direction X of the rows of the matrix arrangement, and which alternate in the direction Y of the columns with an alternating pitch which corresponds to twice the size of a block. FIGS. 3b and 4 shows such an advantageous layout. At a distance from the outside perimeters of each control region 120, each segment of the power supply paths 4 or 5 may be shared by two row portions of control blocks 12 which are adjacent in the Y direction.

Similarly, the layout of the output paths 1 and 2 can be limited to the interior of the functional region(s) 110 of the module 100. FIG. 3b shows that the output paths 1 and 2 are composed of path segments which are parallel with the direction X of the rows of the matrix arrangement, inside each region 110. Thus the output paths 1 and 2 do not cross the power supply paths 4 and 5, and are mainly located apart from them, so that a significant portion of the capacitive interaction between the paths 1 and 2 on the one hand the paths 4 and 5 on the other is eliminated.

In an improvement of the invention, each control region 120 may be separated from the functional region(s) 110 which is (are) adjacent to this control region, by continuous segments of positions in the matrix arrangement which are devoid of control blocks 12 as well as functional blocks 11. In this manner, the segments of the power supply paths 4, 5 of the region 120 of concern, which are close to the outside perimeter of this region 120, are situated further from the segments of the output paths 1, 2 which are located inside each functional region 110. Thus, the capacitive interaction between the output paths 1 and 2 on the one hand and the power supply paths 4 and 5 on the other is decreased by an additional extent. Under these conditions, any one of the functional blocks 11 can have a minimum individual capacitance value within the entire module 100 of about 2.3 pF. This minimum value, which is achieved because of the invention, is on the order of 1.8 times smaller than that of known prior art modules, at the same lithographic pitch for the integrated electronic circuit modules. In FIGS. 3a to 3d, the positions in the matrix arrangement which are without blocks 11 and 12 are crossed out with Xs. They are also labeled with reference number 130 when they separate an adjacent functional region 110 and control region 120.

Figure 3C:
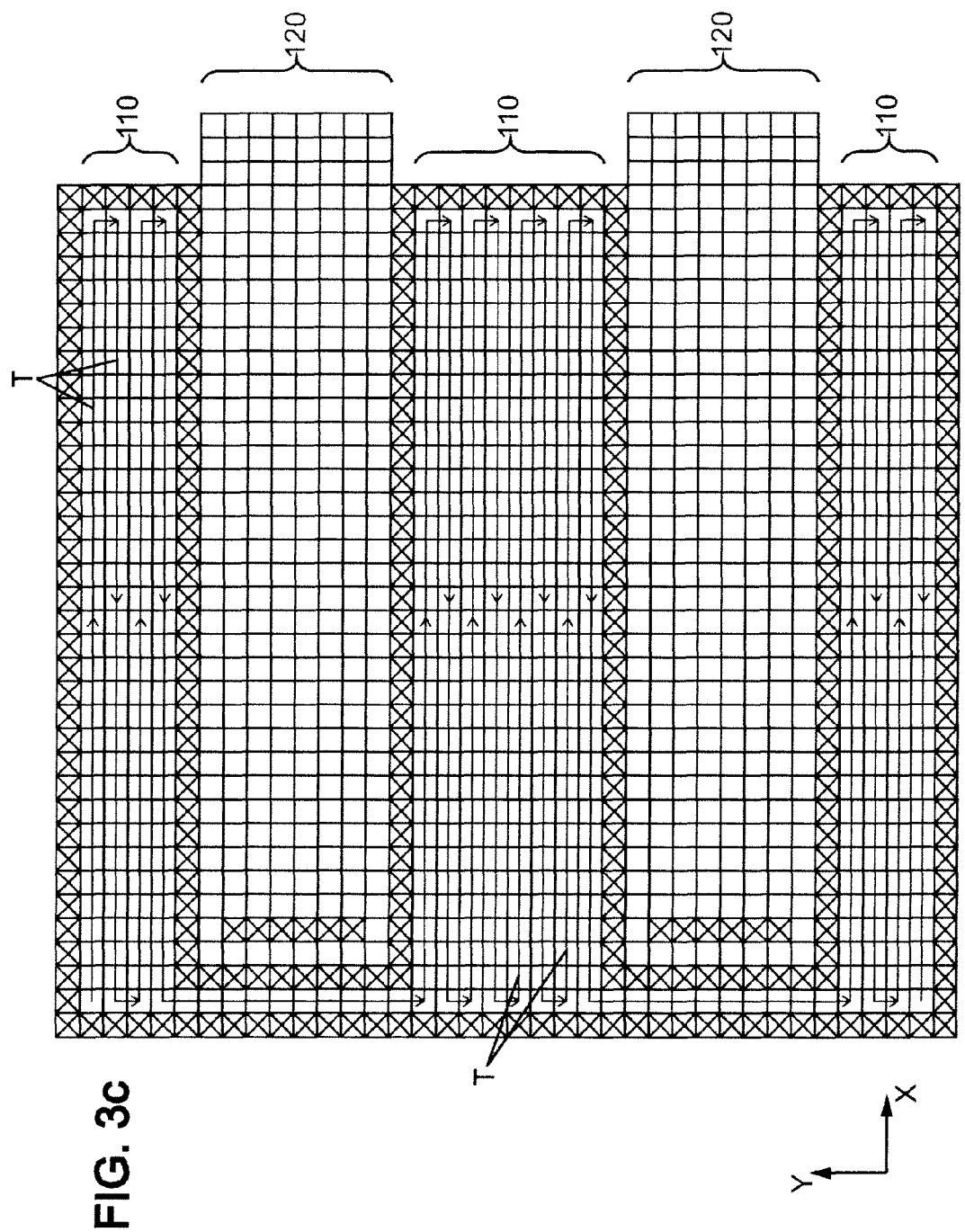
Figure 3D:
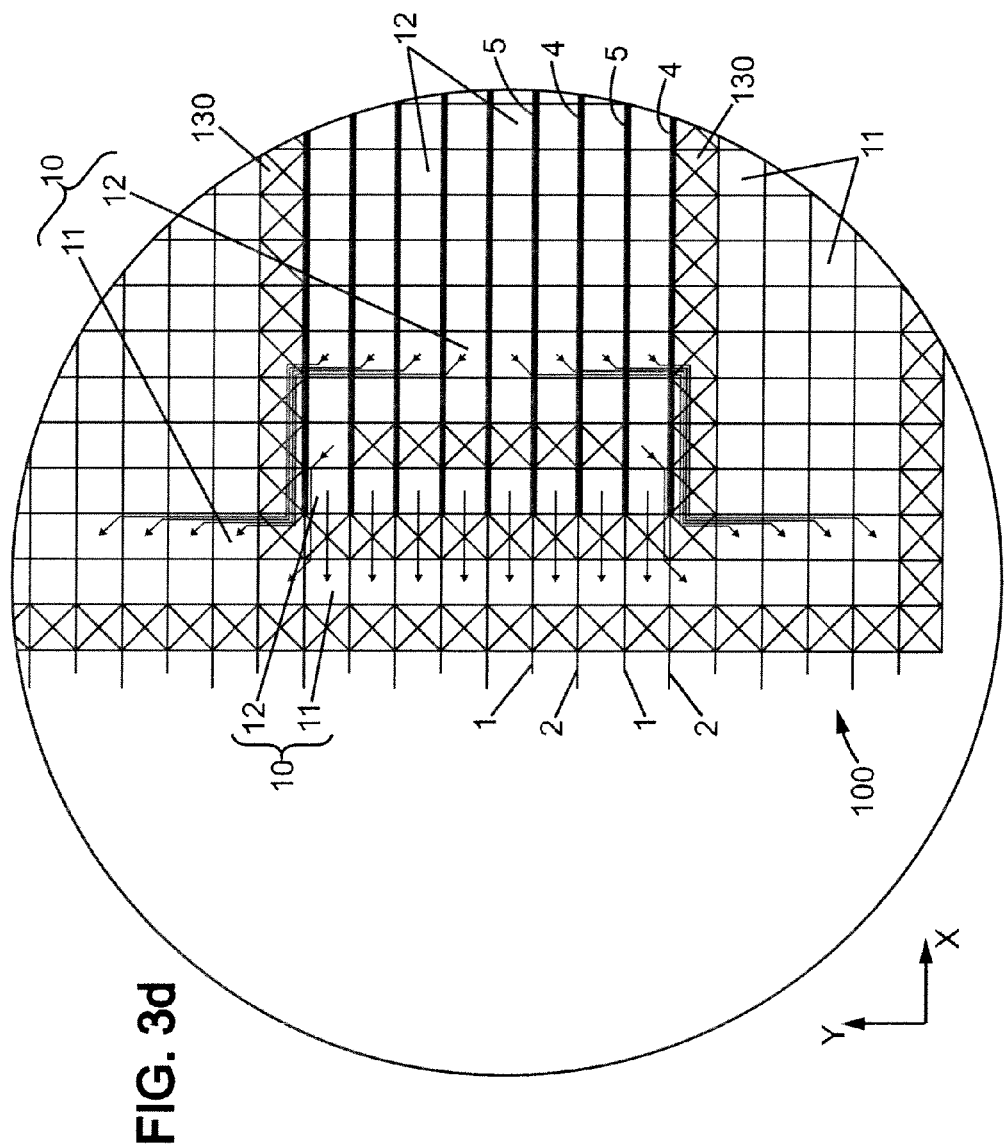
FIG. 3d is an enlarged view of part of FIG. 3b.
Figure 5:
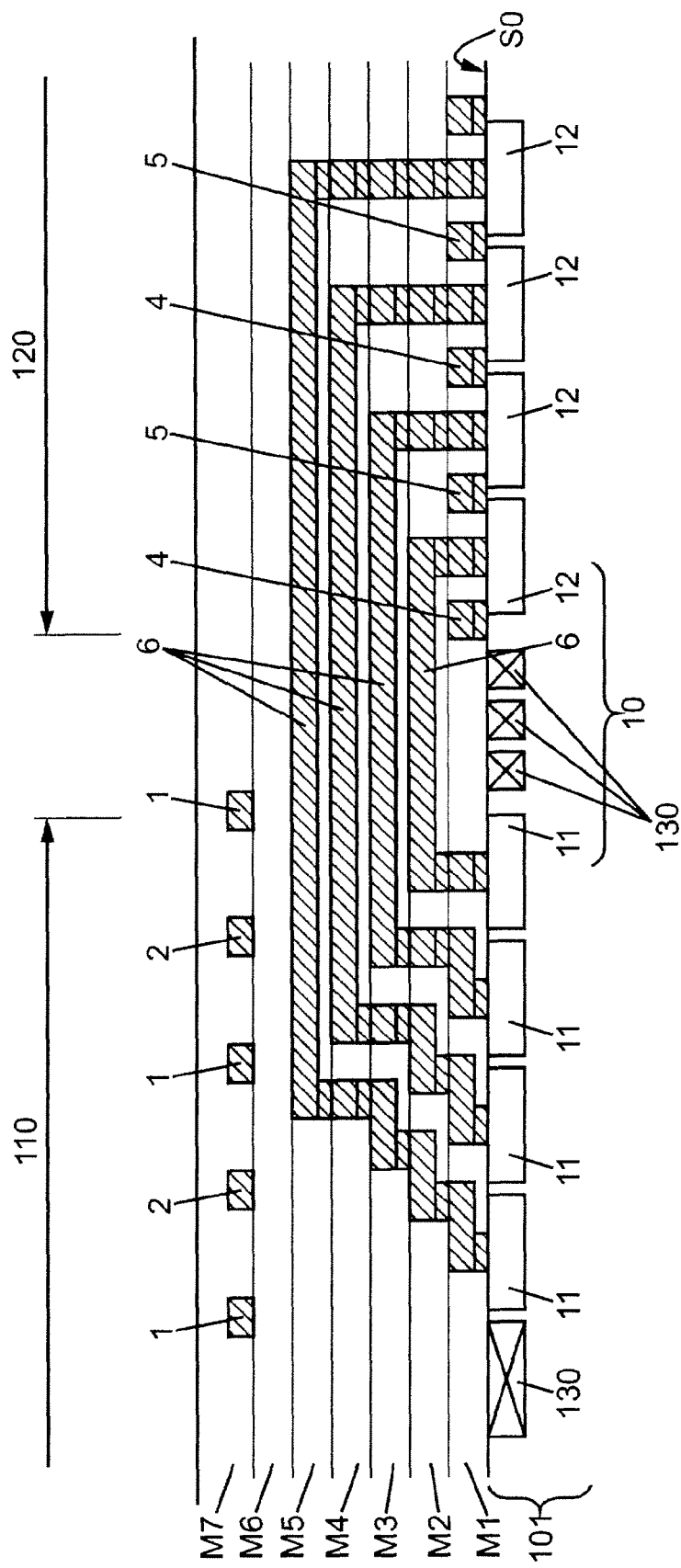
FIG. 5 is a sectional view of a digitally controlled variable capacitance integrated electronic circuit module as shown in FIGS. 3a to 3d.

In one layout of the module 100 according to the invention, a functional block 11 and a control block 12 which belong to the same basic cell 10 are spaced apart from each other. In FIGS. 3b and 3d, arrows show the assigned pairings of control blocks 12 to functional blocks 11 at the extremities of the control regions. This assignment can be logically extended throughout the entire matrix arrangement. The control junction 6 which connects the blocks 11 and 12 of a same basic cell 10 is continuous. FIG. 5 is a cross-section of the module 100 along the dotted line V-V indicated in FIG. 3b. It shows several control junctions 6 which are arranged in the metallization levels of the circuit. In this figure, the reference labels 101, S0 and M1-M7 respectively designate the substrate of the integrated electronic circuit module 100, the useful surface area of this substrate, and seven metallization levels which are superimposed on this surface. The levels M1 to M5 contain the control junctions 6 straddling a functional region 110 and a control region 120. The level M7 contains the segments of the output paths 1 and 2 in the functional region 110. In addition, the metallization level M1 contains the segments of the power supply paths 4 and 5 in the control region 120.

In addition, the basic cells 10 of a module 100 of the invention can still be switched in an order which corresponds to a winding path through the matrix arrangement, when the capacitance value of the entire module is ordered to increase progressively. The path with directional arrows T indicated in FIG. 3c shows such a winding path through all functional blocks 11 of the module 100.

Figure 6:
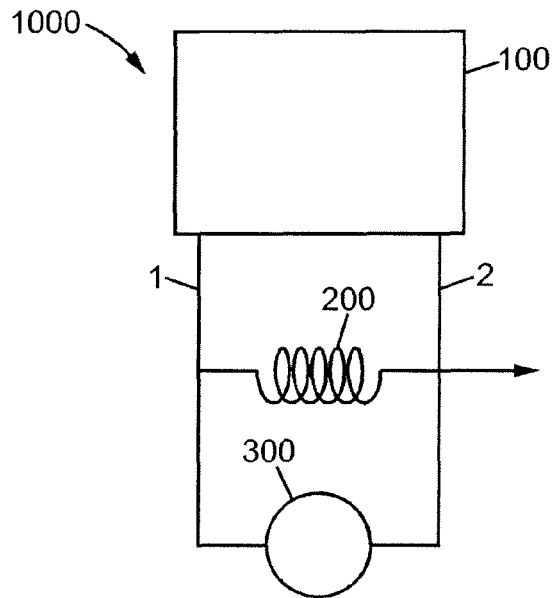
FIG. 6 is a circuit diagram of a digitally controlled variable frequency oscillator according to the invention.

FIG. 6 is a circuit diagram of a variable frequency oscillator 1000 which incorporates the module 100. The reference label 200 designates an inductor for the oscillator, and the reference label 300 designates an active component which compensates for the energy losses of the module 100 and the inductor 200. When the inductor 200 is produced in the form of an integrated electronic circuit track, it may have a value of 0.7 nH. In a known manner, the frequency f of the signal which is produced by the oscillator 1000 is given by the relation: $1/f = 2\pi(LC)^{1/2}$. The maximum frequency $f_{max}$ possible to obtain with the oscillator is then $1/[2\pi(LC_{min})^{1/2}]$. By using the invention, $C_{min}$ can be equal to approximately 2.3 pF, and therefore the maximum frequency of the oscillator 1000 is about 4 GHz.

Figure 7:
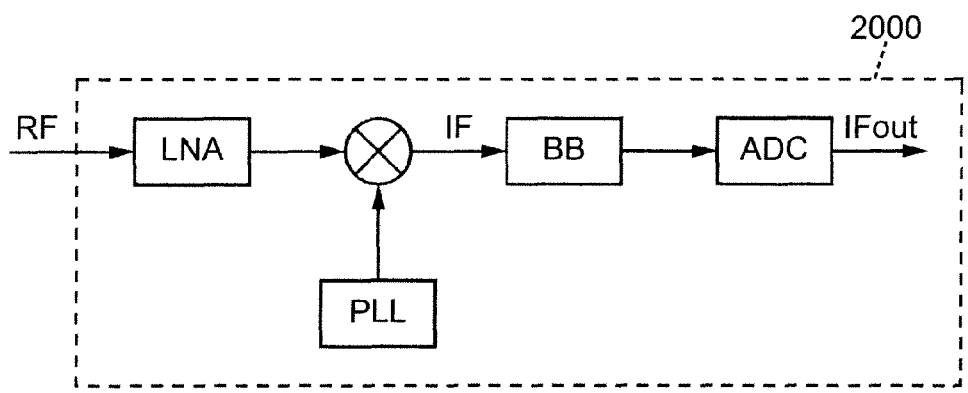
FIG. 7 illustrates a use of a digitally controlled variable frequency oscillator as shown in FIG. 6.

Such a digitally controlled variable frequency oscillator is particularly suitable for incorporation in a mobile telephone terminal. Within the terminal, it can be used for the synthesis of radio signals transmitted or for the demodulation of radio signals received. To this purpose, the oscillator 1000 is commonly incorporated into a phase lock loop. FIG. 7 is a functional diagram of part of the radio receiver for a mobile telephone terminal 2000. It shows the implementation of a phase lock loop which incorporates the oscillator 1000 in order to separate the transmitted data from the radio carrier wave. In this figure, the acronyms used have the following meanings:

RF: radio frequency signal received by the terminal,
LNA: low noise amplifier,
PLL: phase lock loop,
BB: base-band filter,
ADC: analog-digital converter,
IF: intermediate demodulation signal, and
IFout: intermediate signal which is transmitted to the decoder of the receiver.

It is understood that the invention may be implemented while modifying at least some of the advantages which have been mentioned. In particular, the assignment of the functional blocks 11 to the control blocks 12, across the boundary between a functional region 110 and a control region 120, may be modified, as well as the layout of the control junctions 6 in the metallization levels of the integrated electronic circuit module.

The invention claimed is:

1. A digitally controlled variable capacitance integrated electronic circuit module comprising:
   a set of basic cells each having a functional block capable to be switched between several individual capacitance values, a control block, and a control junction connecting the control block and the functional block of a same basic cell, with the functional blocks and the control blocks being distributed on a surface of a substrate of the module in a matrix arrangement formed of columns and rows of juxtaposed blocks;
   two output paths respectively formed of segments of output paths arranged above the substrate and parallel to the rows of the matrix arrangement, with each functional block having two output terminals respectively connected to a segment of one of the two output paths and to a segment of the other output path;
   two power supply paths arranged above the substrate, with each control block having two power supply terminals respectively connected to one and the other of said power supply paths;
   wherein the control blocks are grouped within the matrix arrangement into control regions each comprising multiple row portions, said row portions each comprising multiple juxtaposed control blocks and being adjacent in the matrix arrangement and offset in parallel to the columns, the functional blocks are located outside said control regions, in functional regions of the matrix arrangement which are separate from the control regions; and
   wherein the two power supply paths are formed of segments of supply paths arranged parallel to the rows of the matrix arrangement within the control regions, outside the functional regions, and the segments of the output paths are arranged within the functional regions outside the control regions.

2. A module according to claim 1, wherein each control region comprises at least four, preferably at least eight, row portions which are adjacent in the matrix arrangement and spaced apart in parallel to the columns.

3. A module according to claim 1, wherein at least some of the row portions of each control region each comprise at least four adjacent control blocks.

4. A module according to claim 3, wherein at least some of the row portions of each control region each comprise at least eight adjacent control blocks.

5. A module according to claim 1, wherein the substrate contains doped wells in the control regions, with said doped wells extending continuously across multiple adjacent control blocks in parallel to the rows of the matrix arrangement inside each control region.

6. A module according to claim 1, wherein each control region is separated from the functional regions adjacent to said control region by continuous segments of positions in the matrix arrangement which have no control blocks and functional blocks.

7. A module according to claim 1, wherein the module comprises between 1,000 and 10,000 basic cells (10).

8. A module according to claim 1, wherein the module has a minimum capacitance value of less than 3.0 pF.

9. A module according to claim 8, wherein the module has a minimum capacitance value of less than 2.5 pF.

10. A digitally controlled variable frequency oscillator comprising:
    an inductor;
    a digitally controlled variable capacitance integrated electronic circuit module comprising:
      a set of basic cells each having a functional block capable to be switched between several individual capacitance values, a control block, and a control junction connecting the control block and the functional block of a same basic cell, with the functional blocks and the control blocks being distributed on a surface of a substrate of the module in a matrix arrangement formed of columns and rows of juxtaposed blocks;
      two output paths respectively formed of segments of output paths arranged above the substrate and parallel to the rows of the matrix arrangement, with each functional block having two output terminals respectively connected to a segment of one of the two output paths and to a segment of the other output path;
      two power supply paths arranged above the substrate, with each control block having two power supply terminals respectively connected to one and the other of said power supply paths;
      wherein the control blocks are grouped within the matrix arrangement into control regions each comprising multiple row portions, said row portions each comprising multiple juxtaposed control blocks and being adjacent in the matrix arrangement and offset in parallel to the columns, the functional blocks are located outside said control regions, in functional regions of the matrix arrangement which are separate from the control regions; and
      wherein the two power supply paths are formed of segments of supply paths arranged parallel to the rows of the matrix arrangement within the control regions, outside the functional regions, and the segments of the output paths are arranged within the functional regions outside the control regions.

11. An oscillator according to claim 10, adapted to produce a periodic signal with a maximum frequency of between 3.5 and 4.5 GHz, in response to a digital control code transmitted to the variable capacitance integrated electronic circuit module and corresponding to a minimum value of the capacitance of said module.

12. A mobile telephone terminal comprising:
    an inductor;
    a digitally controlled variable capacitance integrated electronic circuit module comprising:
      a set of basic cells each having a functional block capable to be switched between several individual capacitance values, a control block, and a control junction connecting the control block and the functional block of a same basic cell, with the functional blocks and the control blocks being distributed on a surface of a substrate of the module in a matrix arrangement formed of columns and rows of juxtaposed blocks;
      two output paths respectively formed of segments of output paths arranged above the substrate and parallel to the rows of the matrix arrangement, with each functional block having two output terminals respectively connected to a segment of one of the two output paths and to a segment of the other output path;

two power supply paths arranged above the substrate, with each control block having two power supply terminals respectively connected to one and the other of said power supply paths;

wherein the control blocks are grouped within the matrix arrangement into control regions each comprising multiple row portions, said row portions each comprising multiple juxtaposed control blocks and being adjacent in the matrix arrangement and offset in parallel to the columns, the functional blocks are located outside said control regions, in functional regions of the matrix arrangement which are separate from the control regions; and wherein the two power supply paths are formed of segments of supply paths arranged parallel to the rows of the matrix arrangement within the control regions, outside the functional regions, and the segments of the output paths are arranged within the functional regions outside the control regions.

\* \* \* \* \*